United States Patent
Kiyokawa et al.

(10) Patent No.: US 11,531,043 B2
(45) Date of Patent: Dec. 20, 2022

(54) TEST CARRIER AND CARRIER ASSEMBLING APPARATUS

(71) Applicant: ADVANTEST Corporation, Tokyo (JP)

(72) Inventors: Toshiyuki Kiyokawa, Tokyo (JP); Kazuya Ohtani, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 16/351,348

(22) Filed: Mar. 12, 2019

(65) Prior Publication Data

US 2019/0346482 A1     Nov. 14, 2019

(30) Foreign Application Priority Data

May 11, 2018   (JP) .............................. JP2018-091984

(51) Int. Cl.
*G01R 1/04*   (2006.01)

(52) U.S. Cl.
CPC ......... *G01R 1/0416* (2013.01); *G01R 1/0433* (2013.01)

(58) Field of Classification Search
CPC ................ G01R 1/0466; G01R 1/0416; G01R 1/0433–0441; H01R 12/88
See application file for complete search history.

(56) References Cited

U.S. PATENT DOCUMENTS

| | | | | |
|---|---|---|---|---|
| 3,963,315 A | * | 6/1976 | Bonis .......................... | B60J 1/20 439/72 |
| 4,940,935 A | * | 7/1990 | Riley .................... | G01R 1/0433 324/756.02 |
| 5,074,798 A | * | 12/1991 | Carter .................. | H05K 7/1023 439/331 |
| 5,171,290 A | * | 12/1992 | Olla ...................... | G01R 1/0475 439/66 |
| 5,176,524 A | * | 1/1993 | Mizuno .................. | H05K 1/141 439/329 |

(Continued)

FOREIGN PATENT DOCUMENTS

| | | |
|---|---|---|
| JP | H09-223724 A | 8/1997 |
| JP | H11-271392 A | 10/1999 |

(Continued)

OTHER PUBLICATIONS

Notification of Reason for Refusal issued in corresponding Korean Patent Application No. 10-2019-0024553, dated Feb. 10, 2020, with translation (11 pages).

(Continued)

*Primary Examiner* — Patrick Assouad
*Assistant Examiner* — Demetrius R Pretlow
(74) *Attorney, Agent, or Firm* — Osha Bergman Watanabe & Burton LLP

(57) ABSTRACT

A test carrier carried in a state of accommodating a device under test (DUT) includes: a carrier body that holds the DUT; and a lid member that covers the DUT and is attached to the carrier body. The carrier body has contactors provided to correspond to terminals of the DUT, external terminals electrically connected to the contactors, and a first through-hole for positioning that is provided to face the DUT. The first through-hole penetrates the carrier body so that a part of the DUT is seen from an outside through the first through-hole.

10 Claims, 11 Drawing Sheets

(56) References Cited

U.S. PATENT DOCUMENTS

| | | | | |
|---|---|---|---|---|
| 5,247,250 | A * | 9/1993 | Rios | H05K 7/1069 324/750.22 |
| 5,367,253 | A * | 11/1994 | Wood | G01R 1/0466 257/E21.509 |
| 5,387,120 | A * | 2/1995 | Marks | H05K 7/1023 439/331 |
| 5,647,756 | A * | 7/1997 | Twigg | G01R 1/0433 439/331 |
| 5,757,199 | A | 5/1998 | Maruyama | |
| 5,788,526 | A * | 8/1998 | Twigg | G01R 1/04 439/331 |
| 5,808,474 | A * | 9/1998 | Hively | G01R 1/0483 324/756.02 |
| 5,828,224 | A | 10/1998 | Maruyama | |
| 5,926,027 | A * | 7/1999 | Bumb, Jr. | G01R 31/2886 324/750.25 |
| 5,952,841 | A | 9/1999 | Hiruta | |
| 5,986,459 | A | 11/1999 | Fukaya et al. | |
| 6,018,248 | A * | 1/2000 | Kelley | G01R 31/2893 324/756.02 |
| 6,182,828 | B1 | 2/2001 | Hiruta | |
| 6,297,654 | B1 * | 10/2001 | Barabi | G01R 1/0433 324/756.02 |
| 6,340,838 | B1 | 1/2002 | Chung et al. | |
| 6,545,493 | B1 | 4/2003 | Iino | |
| 6,592,434 | B1 * | 7/2003 | Vanell | B24B 37/30 451/288 |
| 6,821,131 | B2 * | 11/2004 | Suzuki | H01R 13/2421 439/700 |
| 7,005,872 | B1 * | 2/2006 | Lanowitz | B08B 5/00 134/22.12 |
| 7,208,936 | B2 * | 4/2007 | Goldsmith | G01R 1/0433 324/756.02 |
| 7,884,630 | B2 | 2/2011 | Osato et al. | |
| 9,958,476 | B2 * | 5/2018 | Eldridge | G01R 1/0441 |
| 2001/0010462 | A1 * | 8/2001 | Kawanishi | H05K 13/0084 324/750.15 |
| 2002/0079429 | A1 * | 6/2002 | Wittl | H01L 25/167 250/214 R |
| 2002/0163065 | A1 * | 11/2002 | Kuwahara | H01L 23/10 257/678 |
| 2003/0015779 | A1 * | 1/2003 | Kohno | G01R 1/0483 257/678 |
| 2003/0210064 | A1 * | 11/2003 | Huang | G01R 1/0483 324/755.05 |
| 2004/0137767 | A1 | 7/2004 | Suzuki et al. | |
| 2005/0151551 | A1 | 7/2005 | Okuda et al. | |
| 2005/0162152 | A1 * | 7/2005 | Yates | G01R 1/0441 324/756.02 |
| 2005/0181654 | A1 * | 8/2005 | Watanabe | H01R 13/701 439/331 |
| 2006/0068614 | A1 * | 3/2006 | Harper | G01R 1/0466 439/70 |
| 2006/0232291 | A1 | 10/2006 | Wakabayashi et al. | |
| 2007/0126453 | A1 * | 6/2007 | Kim | G01R 31/2889 324/756.02 |
| 2007/0173097 | A1 * | 7/2007 | Kim | G01R 1/0483 439/264 |
| 2008/0014780 | A1 * | 1/2008 | Lin | H01L 23/4093 439/331 |
| 2008/0018353 | A1 * | 1/2008 | Thamarayoor | G01R 1/0483 324/756.02 |
| 2008/0280477 | A1 * | 11/2008 | Hsiao | H05K 7/1053 439/331 |
| 2009/0237098 | A1 * | 9/2009 | Hsu | G01R 31/01 324/757.03 |
| 2010/0097085 | A1 * | 4/2010 | Takatori | G01R 1/0483 324/756.02 |
| 2012/0235699 | A1 * | 9/2012 | Nakamura | G01R 31/2893 324/756.01 |
| 2014/0239993 | A1 | 8/2014 | Hwang | |
| 2014/0268624 | A1 * | 9/2014 | Owen | H03H 9/058 361/813 |
| 2015/0130493 | A1 * | 5/2015 | Kogure | G01R 1/0408 324/756.02 |
| 2017/0010324 | A1 * | 1/2017 | Kim | G01R 31/2893 |
| 2017/0146566 | A1 * | 5/2017 | Eldridge | G01R 1/0441 |
| 2019/0302144 | A1 * | 10/2019 | Nakamura | G01R 1/06711 |

FOREIGN PATENT DOCUMENTS

| | | |
|---|---|---|
| JP | H11-3264499 A | 11/1999 |
| JP | 2000-193720 A | 7/2000 |
| JP | 2000-304809 A1 | 11/2000 |
| JP | 2001-033520 A | 2/2001 |
| JP | 2001-102418 A | 4/2001 |
| JP | 2001-208795 A | 8/2001 |
| JP | 2003-523073 A | 7/2003 |
| JP | 2004-152495 A | 5/2004 |
| JP | 2006-145551 A | 6/2006 |
| JP | 2006-300926 A | 11/2006 |
| KR | 19990075036 A | 10/1999 |
| KR | 20090133141 A | 12/2009 |
| KR | 20140127274 A | 11/2014 |
| TW | 200409929 A | 6/2004 |
| TW | 200912340 A | 3/2009 |
| TW | 201411149 A | 3/2014 |
| TW | 201700979 A | 1/2017 |
| WO | 1997/027492 A1 | 7/1997 |
| WO | 00/035262 A2 | 6/2000 |
| WO | 03/075023 A1 | 9/2003 |
| WO | 2004074858 A1 | 9/2004 |
| WO | 2013042919 A1 | 3/2013 |

OTHER PUBLICATIONS

Office Action issued in corresponding Taiwanese Patent Application No. 10920349500, dated Apr. 16, 2020 (6 pages).
Office Action issued in corresponding Taiwanese Application No. 108107191, dated Sep. 11, 2019 (3 pages).
Notification of Reason for Refusal issued in corresponding Japanese Patent Application No. 2018-091984, dated Feb. 1, 2022 (8 pages).
Notification of Reason for Refusal issued in corresponding Japanese Patent Application No. 2021-149667, dated Apr. 12, 2022 (4 pages).
Notification of Reason for Refusal issued in corresponding Japanese Patent Application No. 2021-149668, dated Apr. 12, 2022 (6 pages).
Notification of Reason for Refusal issued in corresponding Japanese Patent Application No. 2021-149669, dated Apr. 12, 2022 (6 pages).
Notification of Reason for Refusal issued in corresponding Japanese Patent Application No. 2021-149673, dated Apr. 12, 2022 (6 pages).
Notice of Reasons for Refusal issued in corresponding Japanese Application No. 2018-091984 dated Jul. 5, 2022 (6 pages).
Notice of Reason for Refusal issued in corresponding Japanese Application No. 2021-149673 dated Jul. 5, 2022 (5 pages).
Notice of Reason for Refusal issued in corresponding Japanese Application No. 2021-149667 dated Jul. 12, 2022 (6 pages).
Notice of Reasons for Refusal issued in corresponding Japanese Application No. 2021-149668 dated Jul. 12, 2022 (4 pages).
Notice of Reasons for Refusal issued in corresponding Japanese Application No. 2021-149669 dated Jul. 12, 2022 (6 pages).
Notice of Reason for Refusal issued in corresponding Japanese Application No. 2018-091984 dated Nov. 8, 2022 (13 pages).
Notice of Reasons for Refusal issued in related Japanese Application No. 2021-149673 dated Nov. 8, 2022 (10 pages).
Notice of Reasons for Refusal issued in related Japanese Application No. 2021-149667 dated Nov. 8, 2022 (15 pages).
Notice of Reasons for Refusal issued in related Japanese Application No. 2021-149668 dated Nov. 8, 2022 (7 pages).

* cited by examiner

TEST CARRIER AND CARRIER ASSEMBLING APPARATUS

TECHNICAL FIELD

The present invention relates to a test carrier carried in a state of accommodating an electronic component to be tested (hereinafter simply referred to as a "device under test" (DUT)) such as a semiconductor integrated circuit device at the time of testing the DUT, and a carrier assembling apparatus for assembling the test carrier.

The present application claims priority from Japanese Patent Application No. 2018-091984 filed on May 11, 2018. The contents described and/or illustrated in the documents relevant to the Japanese Patent Application No. 2018-091984 will be incorporated herein by reference as a part of the description and/or drawings of the present application.

BACKGROUND ART

As an electronic component carrying apparatus (hereinafter also simply referred to as a "handler") used for testing a DUT having a terminal of a fine pitch, an apparatus that positions a DUT with respect to a socket using an image processing technology has been known (for example, see Patent Document 1).

CITATION LIST

Patent Document 1: WO 03/075023 A

SUMMARY OF THE INVENTION

Problem to be Solved by the Invention

The handler requires a plurality of cameras for capturing an image of a DUT, a socket, etc. for image processing and requires a precise moving mechanism for high accurate positioning, and thus the handler itself is expensive. In addition, in the handler, since the number of simultaneous measurements (the number of DUTs which can execute a test at the same time) is limited to about several, productivity is inferior. For this reason, there is a problem that when the handler is used for testing the fine pitch DUT, a cost of a test process is increased.

A problem to be solved by the invention is to provide a test carrier that enables testing of a fine pitch DUT using a handler having a mechanical positioning mechanism, and a carrier assembling apparatus for assembling the test carrier.

Means for Solving Problem

[1] A test carrier according to the invention is a test carrier carried in a state of accommodating a DUT, the test carrier including a carrier body that holds the DUT, and a lid member that covers the DUT and is attached to the carrier body, in which the carrier body has contactors provided to correspond to terminals of the DUT, external terminals electrically connected to the contactors, and a first through-hole for positioning that is provided to face the DUT, and the first through-hole penetrates the carrier body so that a part of the DUT is seen from an outside through the first through-hole.

[2] In the invention, a pitch of the external terminals may be wider than a pitch of the contactors.

[3] In the invention, the contactors may include pogo pins that press the terminals of the DUT, and the DUT may be pinched between the pogo pins and the lid member by pressing forces of the pogo pins.

[4] In the invention, the carrier body may include a holding plate that holds the contactors, and an interposer that the holding plate is laid on, and the interposer may include the external terminals, internal terminals provided to face the contactors, and a wiring pattern that connects the internal terminals and the external terminals to each other.

[5] In the invention, the test carrier may include a latch mechanism that detachably attached the lid member to the carrier body.

In the invention, the test carrier may include an identifier that identifies the test carrier.

[7] In the invention, the lid member may have a second through-hole for sucking that is provided to face the DUT, the second through-hole penetrating the lid member.

[8] A carrier assembling apparatus according to the invention is a carrier assembling apparatus for assembling the test carrier, the carrier assembling apparatus including an imaging unit that captures an image of the DUT through the first through-hole, an image processing unit that acquires a relative position of a feature point of the DUT with respect to the first through-hole from image information captured by the imaging unit, a driving unit that moves the DUT relative to the carrier body, and a controller that controls the driving unit, in which the controller controls the driving unit on the basis of the relative position of the feature point.

[9] In the invention, the carrier assembling apparatus may further include a reader that reads the identifier, and a storage unit that stores individual unique information corresponding to the identifier, in which the individual unique information may include a correction value corresponding to an error of a relative position of the first through-hole with respect to the contactor, and the controller may control the driving unit on the basis of the relative position of the feature point and the individual unique information.

[10] In the invention, the carrier assembling apparatus may further include a sucking and holding unit that sucks and holds the lid member and sucks and holds the DUT through the second through-hole, in which the driving unit may move the sucking and holding unit.

Effect of the Invention

According to the invention, a part of a DUT can be seen from the outside using a first through-hole formed in a carrier body, and thus it is possible to test the DUT by a testing apparatus through a test carrier after highly accurately positioning a terminal of the DUT with respect to a contactor of the test carrier using an image processing technology. For this reason, it is possible to test the DUT using a handler having a mechanical positioning mechanism, and it is possible to reduce a cost of a test process of the DUT.

MODE(S) FOR CARRYING OUT THE INVENTION

Hereinafter, an embodiment of the invention will be described with reference to drawings.

Figure 1:
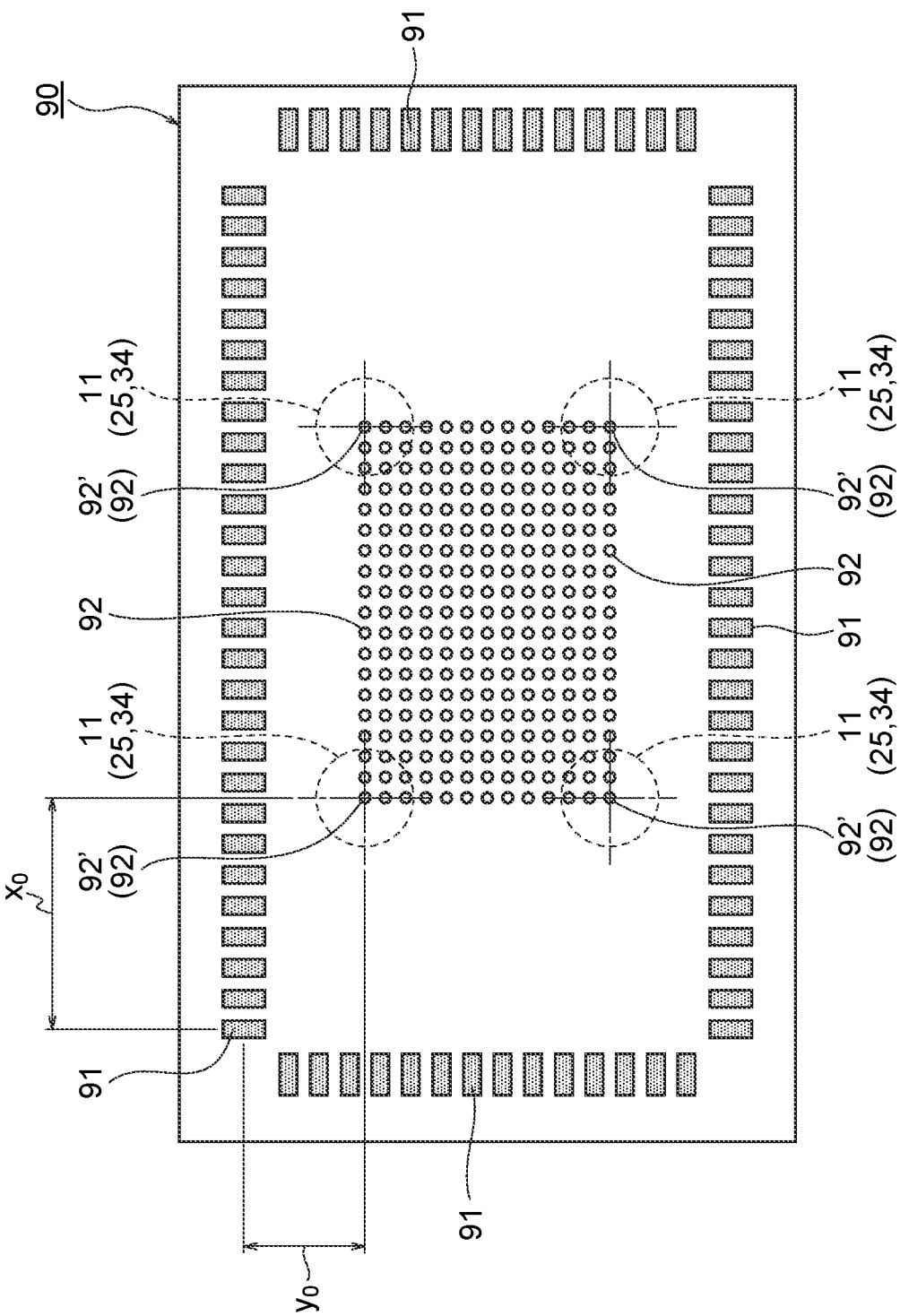
FIG. 1 is a bottom view illustrating a DUT which is a test object in an embodiment of the invention.

FIG. 1 is a bottom view illustrating a DUT which is a test object in the present embodiment.

A DUT 90 in the present embodiment is a die formed by dicing a semiconductor wafer, and an electrical characteristic of the DUT 90 is tested using a test carrier 1.

As illustrated in FIG. 1, the DUT 90 has pads 91 arranged along an outer edge of the DUT 90 and bumps 92 arranged in a center of the DUT 90. The pads 91 are terminals for testing the DUT 90, and are arranged at a relatively wide pitch. On the other hand, the bumps 92 are terminals for mounting the DUT 90 on a substrate, etc., and are arranged at a narrower pitch than the pitch of the pads 91. A plurality of bumps 92 is arranged in a rectangular shape. A configuration of the DUTs 90 is not particularly limited to the above description. Each of the pads 91 in the present embodiment corresponds to an example of a terminal of the DUT in the invention.

Figure 9:
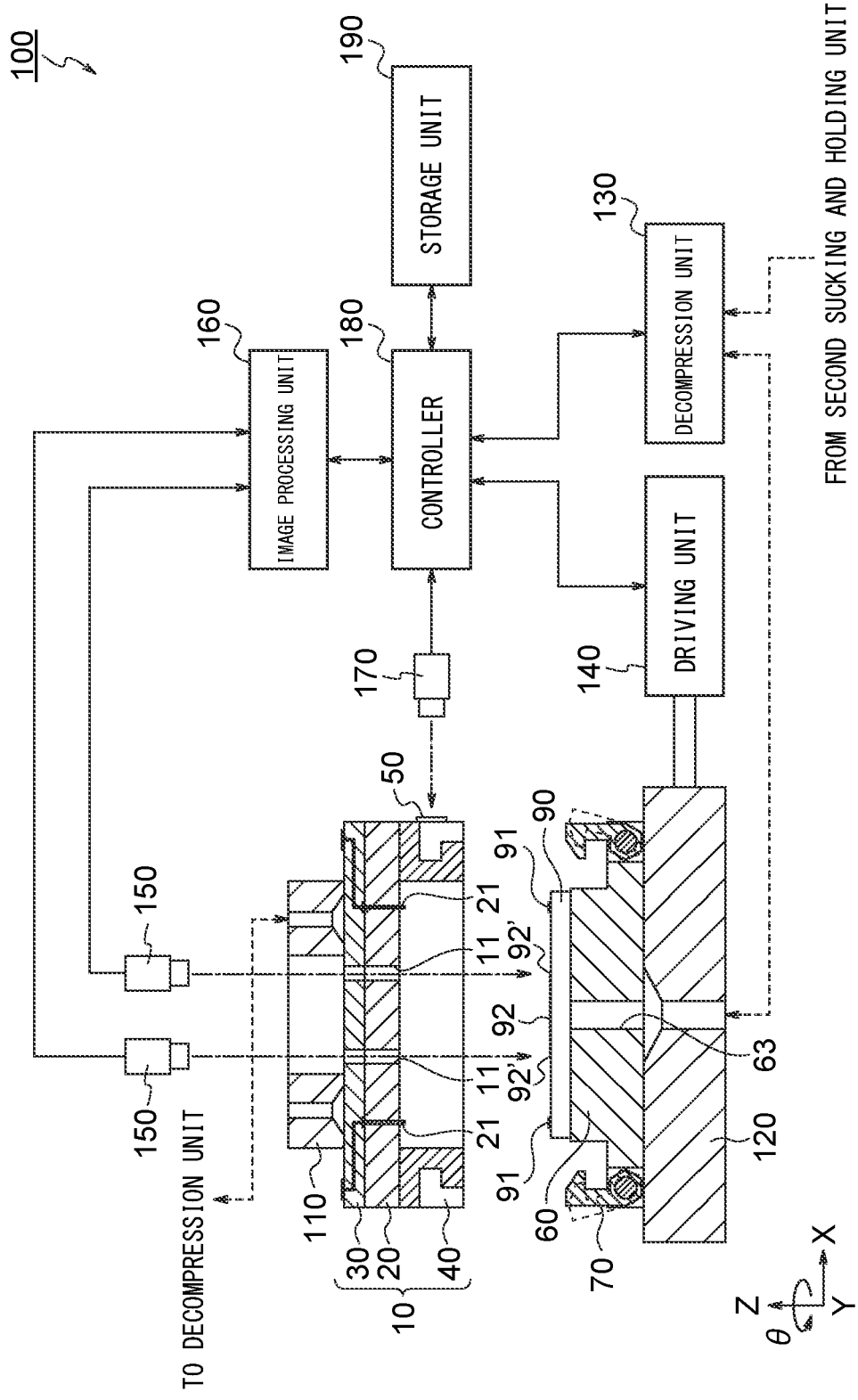
FIG. 9 is a block diagram illustrating a configuration of a carrier assembling apparatus in the embodiment of the invention.

In the present embodiment, when the semiconductor wafer is diced to form the DUT 90, first, the DUT 90 is accommodated in the test carrier 1 using a carrier assembling apparatus 100 (see FIG. 9). Then, the test carrier 1 is carried to a testing apparatus 200 while the DUT 90 is accommodated in the test carrier 1. Subsequently, the DUT 90 and the testing apparatus 200 are electrically connected via the test carrier 1, and the test of the DUT 90 is executed. Then, when this test is completed, the test carrier 1 is disassembled and the DUT 90 is taken out. The test carrier 1 from which the DUT 90 is taken out is reused for testing of another DUT 90.

Incidentally, in a test process of an existing packaged device, a test tray is used to carry a large number of such devices at the same time. In the present embodiment, a test tray for the existing device can also be used to carry the test carrier 1 by matching an outer shape of the test carrier 1 with an outer shape of such existing device.

Next, a configuration of the test carrier 1 according to the present embodiment will be described with reference to FIG. 2 to FIG. 7.

Figure 2:
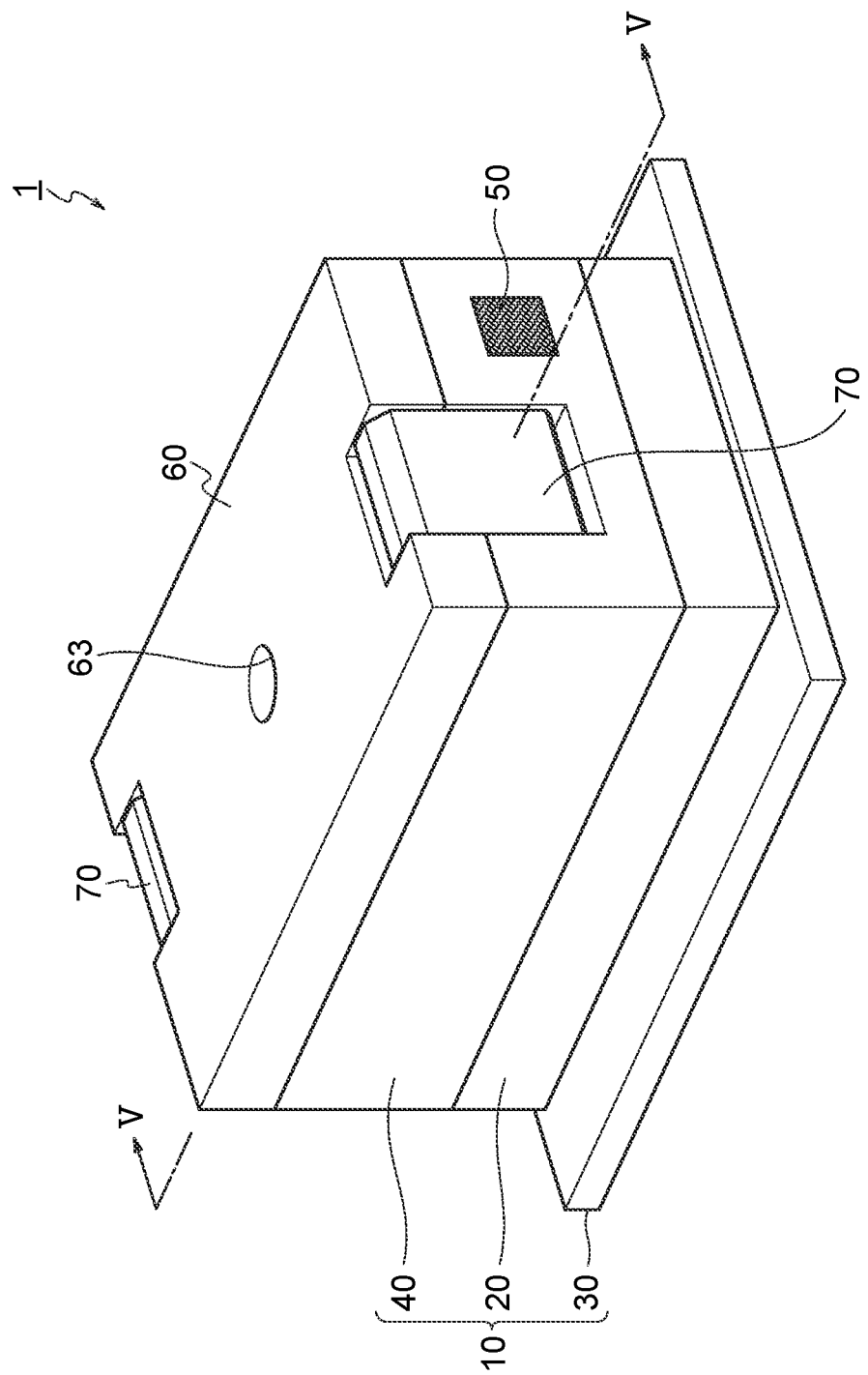
FIG. 2 is a perspective view of a test carrier in the embodiment of the invention viewed from above.
Figure 3:
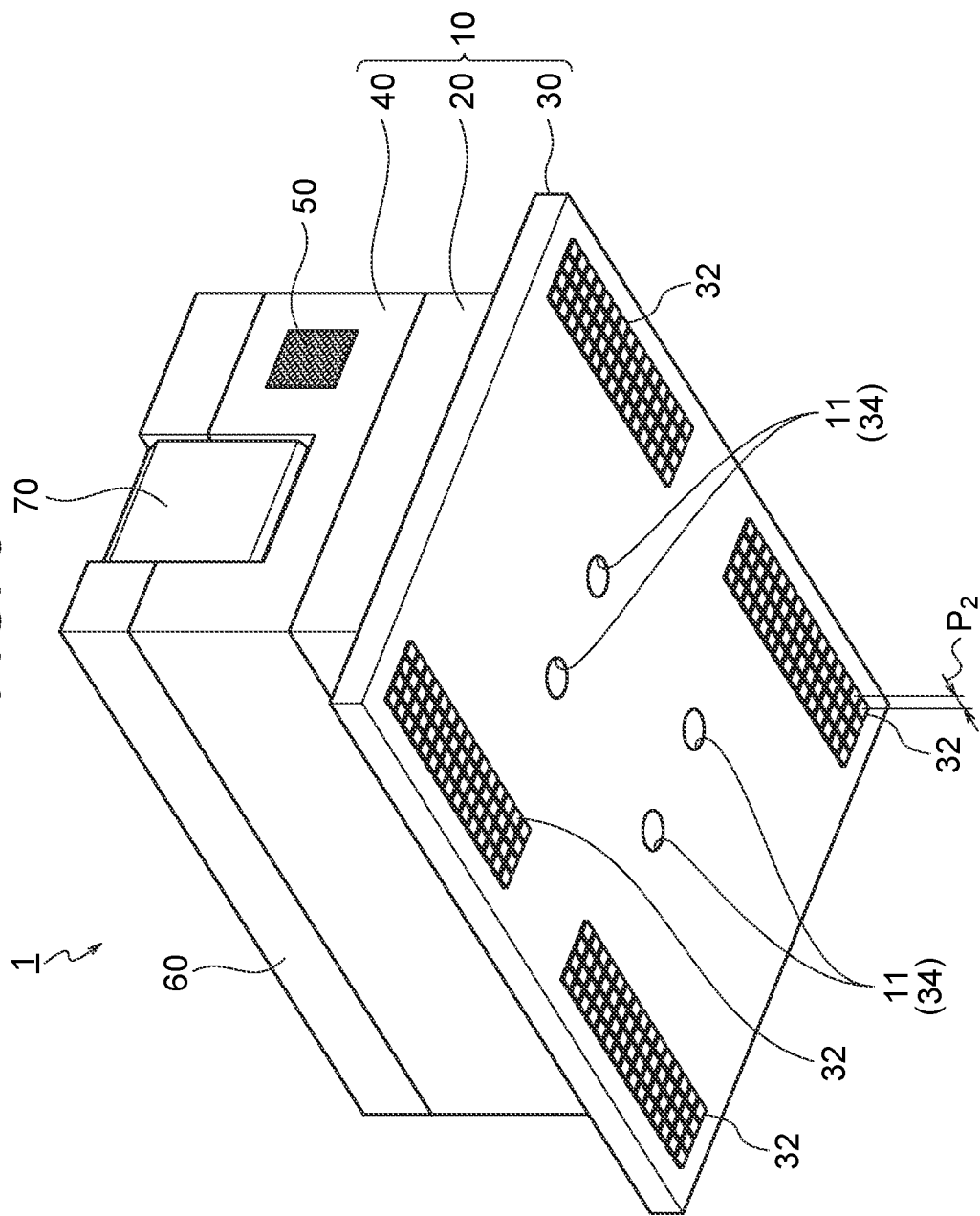
FIG. 3 is a perspective view of the test carrier in the embodiment of the invention viewed from below.
Figure 4:
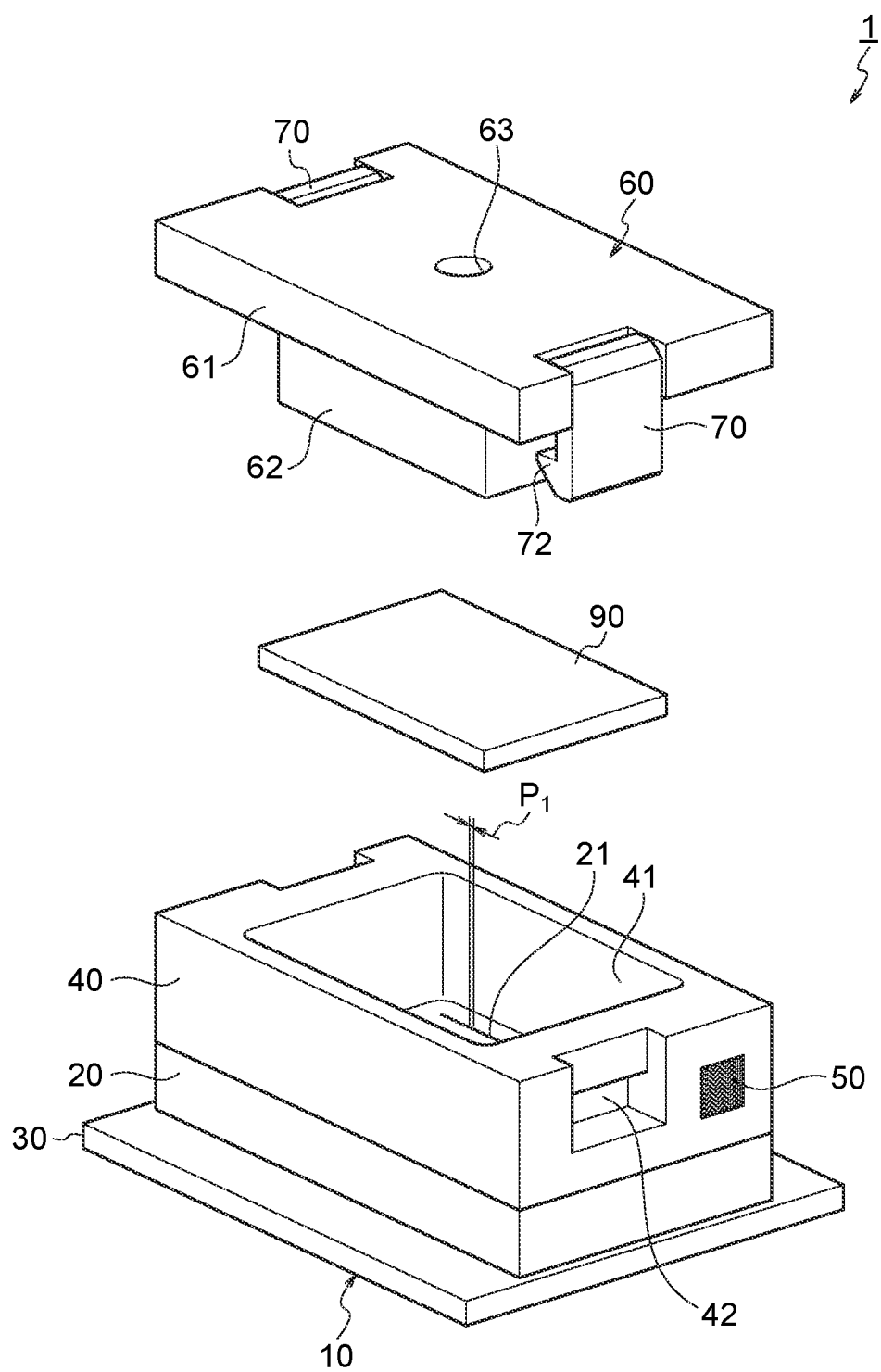
FIG. 4 is an exploded perspective view of the test carrier in the embodiment of the invention.
Figure 5:
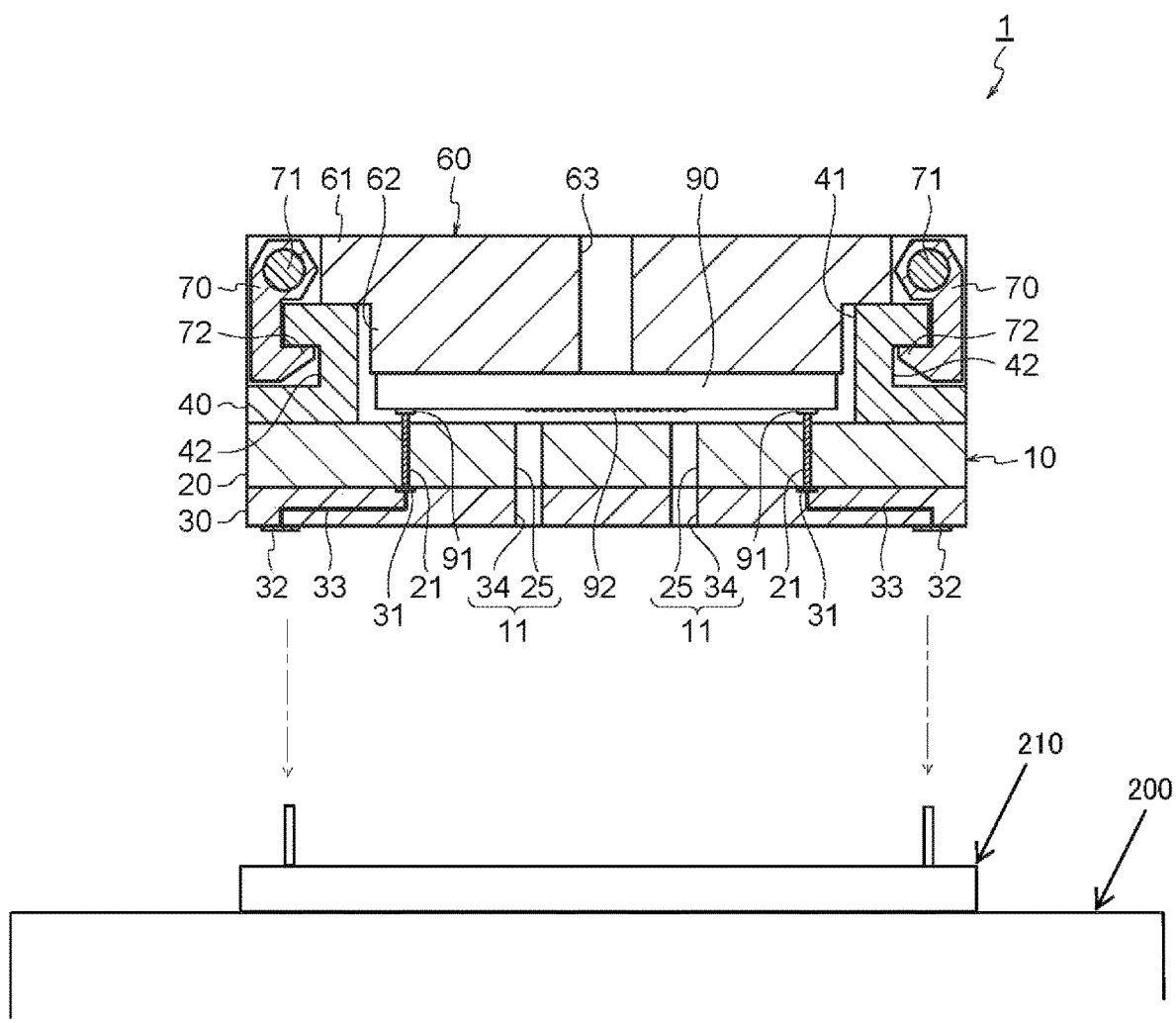
FIG. 5 is a cross-sectional view illustrating the test carrier in the embodiment of the invention and is a diagram taken along V-V line of FIG. 2.
Figure 6:
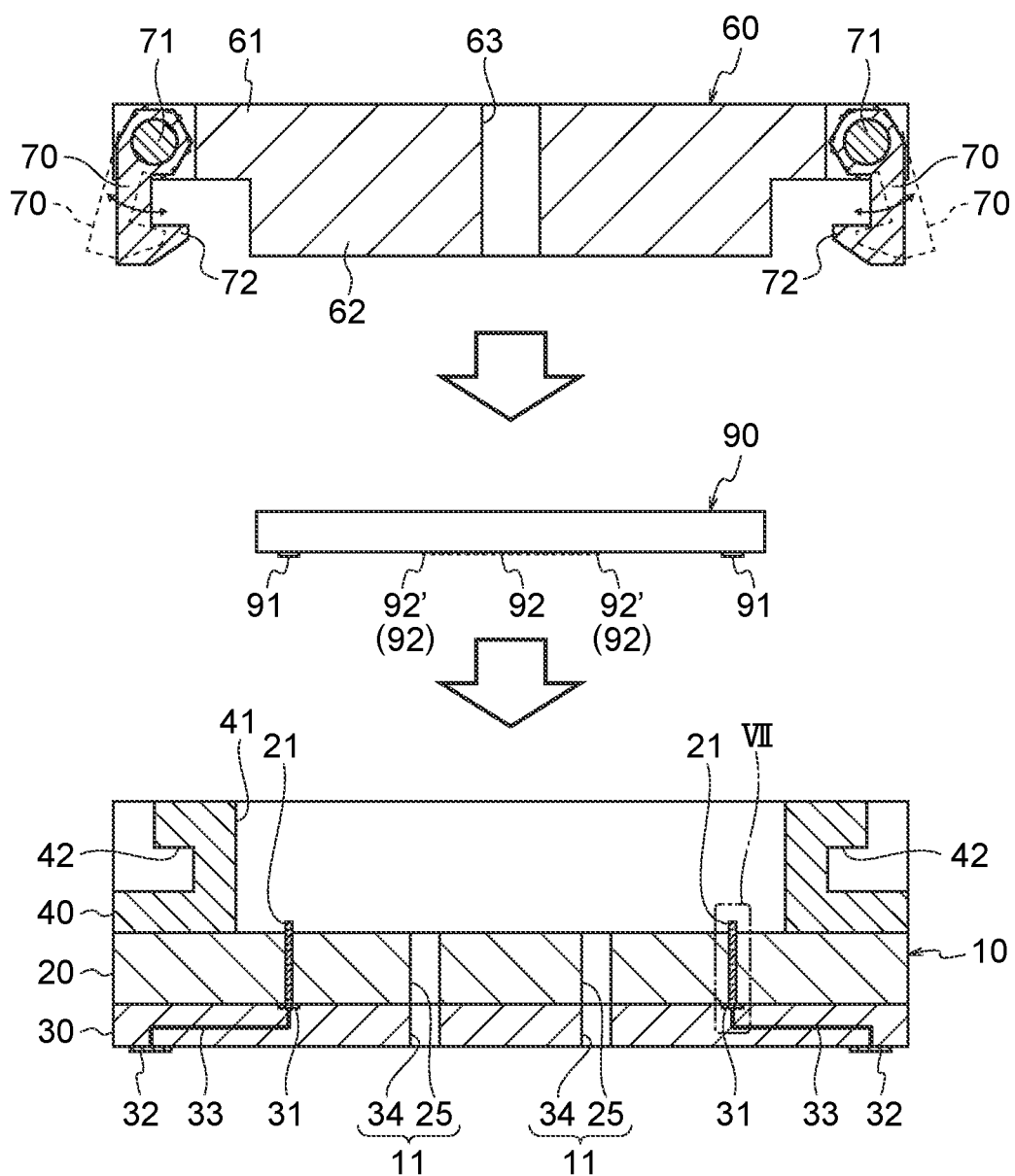
FIG. 6 is an exploded cross-sectional view illustrating the test carrier in the embodiment of the invention.
Figure 7:
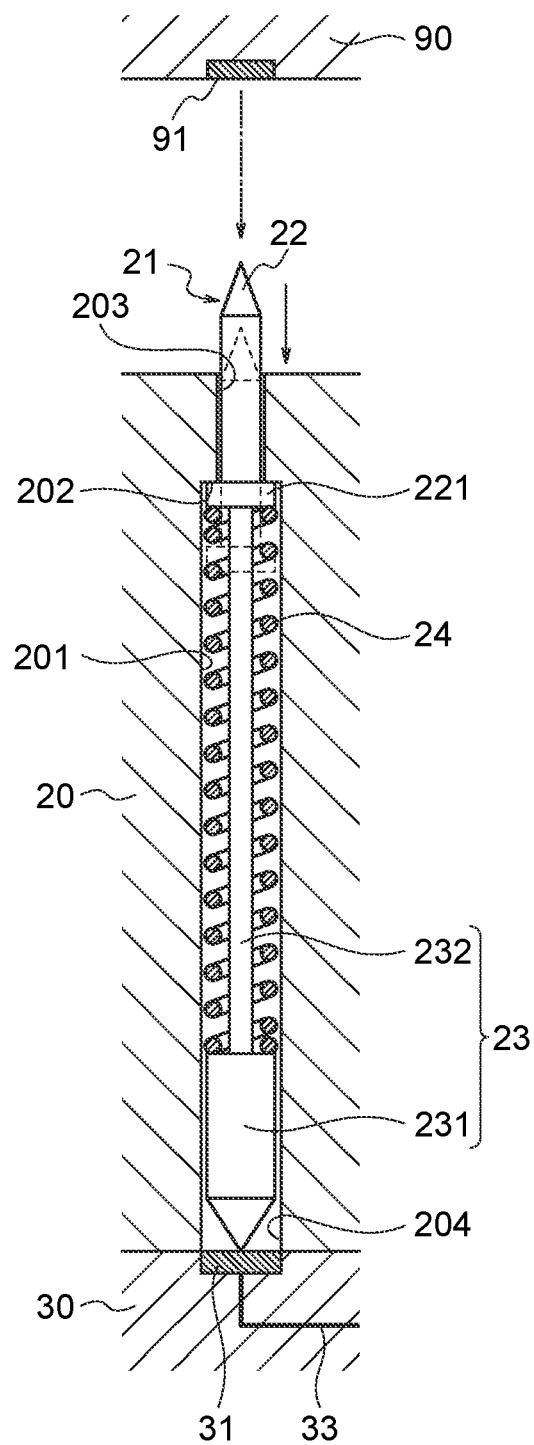
FIG. 7 is a cross-sectional view illustrating a pogo pin of the test carrier in the embodiment of the invention and is an enlarged view of a portion VII of FIG. 6.

FIG. 2 and FIG. 3 are perspective views illustrating the test carrier in the present embodiment, FIG. 4 is an exploded perspective view of the test carrier in the present embodiment, FIG. 5 is a cross-sectional view illustrating the test carrier in the present embodiment, FIG. 6 is an exploded cross-sectional view illustrating the test carrier in the present embodiment, and FIG. 7 is a cross-sectional view illustrating a pogo pin of the test carrier in the present embodiment.

As illustrated in FIG. 2 to FIG. 6, the test carrier 1 in the present embodiment includes a carrier body 10 that holds the DUT 90 and a lid member 60 that covers the DUT 90 and is attached to the carrier body 10. In this test carrier 1, by sandwiching the DUT 90 between the carrier body 10 and the lid member 60, the DUT 90 is accommodated in the test carrier 1.

The carrier body 10 includes a holding plate 20, an interposer 30 overlapped with a lower surface of the holding plate 20, and a tubular body 40 attached to an upper surface of the holding plate 20.

The holding plate 20 holds a plurality of pogo pins 21. The pogo pins 21 are arranged at a pitch $P_1$ (see FIG. 4) to face the pads 91 of the DUT 90. As illustrated in FIG. 7, each of the pogo pins 21 includes a plunger 22, a fixing portion 23, and a coil spring 24.

Each of the pogo pins 21 is inserted into a holding hole 201 of the holding plate 20. Further, a flange 221 of the plunger 22 is engaged with a step 202 of the holding hole 201, whereby an upper limit position of the plunger 22 is restricted. At this upper limit position, a distal end of the plunger 22 protrudes from an opening 203 on an upper side of the holding hole 201. The fixing portion 23 includes a rear end 231 positioned in the opposite side opening 204 of the holding hole 201 and a shaft portion 232 extending from the rear end 231 toward the distal end (upward). The shaft portion 232 is inserted into the coil spring 24, and the coil spring 24 is interposed between the flange 221 of the plunger 22 and the rear end 231 of the fixing portion 23. When the DUT 90 is accommodated in the test carrier 1, the plunger 22 comes into contact with the pad 91 of the DUT 90, the plunger 22 presses the pad 91 by an elastic force of the coil spring 24, and the DUT 90 is held by the pogo pin 21.

In addition, four openings 25 penetrating the holding plate 20 are formed in the holding plate 20. Each of the openings 25 is disposed to face a bump 92 positioned at a corner (hereinafter also simply referred to as a "bump 92") among the plurality of bumps 92 arranged in the rectangular shape on a lower surface of the DUT 90 (see FIG. 1 and FIG. 11A to FIG. 11C). In the present embodiment, at the time of assembling the test carrier 1, this bump 92' is used as a feature point for positioning of the DUT 90 with respect to the test carrier 1.

The interposer 30 is stacked on the lower surface of the holding plate 20 and fixed to the holding plate 20 by thread fastening, etc. As illustrated in FIG. 4 to FIG. 6, the interposer 30 includes internal terminals 31, external terminals 32, and wiring patterns 33.

The internal terminals 31 are provided on an upper surface of the interposer 30. The internal terminals 31 are arranged at a pitch $P_1$ to face the pogo pins 21 held by the holding plate 20, and the fixing portions 23 of the pogo pins 21 are in contact with the internal terminals 31.

The external terminals 32 are provided on a lower surface of the interposer 30 and are exposed to the outside of the test carrier 1. The external terminals 32 are terminals to which contact pins of a socket 210 of the testing apparatus 200 are electrically connected during testing of the DUT 90, and the external terminals 32 are arranged at a wider pitch $P_2$ (see FIG. 3) than the pitch $P_1$ of the internal terminals 31 ($P_2 > P_1$). The internal terminal 31 and the external terminal 32 are connected by the wiring pattern 33.

In addition, as illustrated in FIG. 3, four openings 34 penetrating the interposer 30 are formed in the interposer 30. Each of openings 34 is disposed to be substantially coincident with the opening 25 of the holding plate 20 described above. Therefore, first through-holes 11 linearly penetrating the carrier body 10 are formed by the openings 25 and 34. A part (specifically, the bump 92') of the DUT 90 can be seen from the outside through the first through-holes 11.

Figure 8:
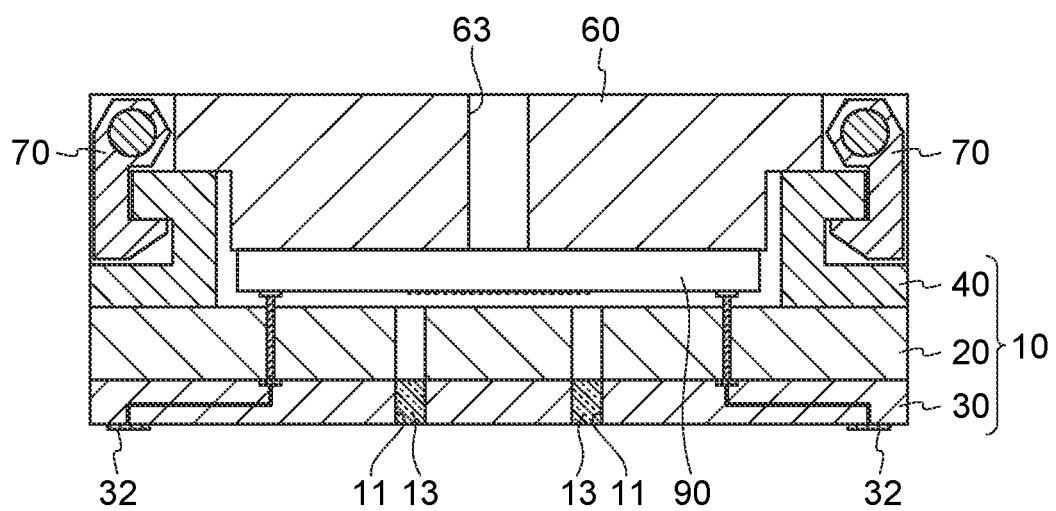
FIG. 8 is a cross-sectional view illustrating a modification of the test carrier in the embodiment of the invention.

FIG. 8 is a cross-sectional view illustrating a modification of the test carrier in the present embodiment. As illustrated in FIG. 8, transparent closing members 13 may be inserted into the first through-holes 11 to close the first through-holes 11. For example, specific examples of a material forming the transparent closing members 13 may include a transparent resin such as polycarbonate (PC) or glass. When the first through-holes 11 are closed by the closing members 13, an internal space of the test carrier 1 is hermetically sealed, and it is possible to lower the class of cleanliness of the internal space. In this way, it possible to test a device close to a bare die or the bare die itself requiring high cleanliness (Class 5 to 6/Class 100 to 1,000) in handling environment using a handler in an environment having low cleanliness (Class 7/Class 10,000).

Returning to FIG. 2 to FIG. 6, the tubular body 40 is provided on the upper surface of the holding plate 20 and is fixed to the holding plate 20 by thread fastening, etc. The tubular body 40 has a rectangular tubular shape having an inner hole 41 larger than the outer shape of the DUT 90 and can surround a periphery of the DUT 90 held by the holding plate 20. A recess 42 is formed on a side surface of the tubular body 40 to correspond to a latch 70 (described below) of the lid member 60. The latch 70 is engaged with the recess 42, whereby the lid member 60 is detachably attached to the carrier body 10.

In addition, a two-dimensional (2D) barcode 50 is stuck on the side surface of the tubular body 40. The 2D barcode 50 represents an identification (ID) of the test carrier 1 and is used to identify the test carrier 1. In the present embodiment, as described below, the 2D barcode 50 is used to take an error unique to the individual test carrier 1 into consideration when the DUT 90 is positioned with respect to the test carrier 1 by the carrier assembling apparatus 100. Means representing the ID of the test carrier 1 is not particularly limited to the 2D barcode as long as the means is an identifier capable of identifying the test carrier 1.

Use of the 2D barcode 50 is not particularly limited to the above description. For example, the 2D barcode 50 may be associated with an electrical resistance value of the test carrier 1 on a database. Alternatively, the 2D barcode 50 may be associated with the DUT 90 itself or a test result of the DUT 90 on the database. In this way, a user can collate the test carrier 1 used for the test of the DUT 90, and it is possible to ensure excellent traceability (device tracking) of the DUT 90. In addition, in a case where a defective DUT 90 frequently occurs in a specific test carrier 1, it is possible to detect a defect of the test carrier 1 itself.

The lid member 60 includes a plate-like main body 61, a pusher 62 protruding downward from the main body 61 in a convex shape, and a pair of latches 70 protruding downward from both ends of the main body 61.

The pusher 62 comes into contact with an upper surface of the DUT 90 held by the holding plate 20 to press the DUT 90. A pressing amount of the DUT 90 by the pusher 62 is limited by the tubular body 40 of the carrier body 10 abutting against the main body 61 of the lid member 60. In this state, a pressing force of the pogo pin 21 with respect to the pad 91 of the DUT 90 is set to an optimum value.

A second through-hole 63 penetrating through the main body 61 and the pusher 62 is formed substantially at a center of the main body 61. The second through-hole 63 is used for sucking and holding the DUT 90 by the carrier assembling apparatus 100 (described below).

The latches 70 are rotatably supported by shafts 71 at both ends of the main body 61, and each of the latches extends downward. Each of the latches 70 is urged inward by a spring (not particularly illustrated). A claw 72 protruding inward is provided at a distal end of each of the latches 70. The lid member 60 is attached to the carrier body 10 by the claw 72 engaged with the recess 42 of the carrier body 10.

Next, a configuration of the carrier assembling apparatus 100 for assembling the test carrier 1 described above will be described with reference to FIG. 9. FIG. 9 is a block diagram illustrating the configuration of the carrier assembling apparatus in the present embodiment.

As illustrated in FIG. 9, the carrier assembling apparatus 100 in the present embodiment includes a first sucking and holding unit 110, a second sucking and holding unit 120, a decompression unit 130, a driving unit 140, a camera 150, an image processing unit 160, a reader 170, a controller 180, and a storage unit 190.

The first sucking and holding unit 110 is connected to the decompression unit 130, and can suck and hold the carrier body 10. The sucking and holding unit 120 is also connected to the decompression unit 130, and can suck and hold the lid member 60. Although not particularly limited, for example, specific examples of the first and second sucking and holding units 110 and 120 may include a suction pad. For example, examples of the decompression unit 130 may include a vacuum pump.

In the present embodiment, the carrier body 10 is held by the first sucking and holding unit 110 in an inverted state, and the lid member 60 is also held by the second sucking and holding unit 120 in an inverted state. In addition, in the present embodiment, the DUT 90 is placed on the lid member 60, and the DUT 90 is sucked and held by the second sucking and holding unit 120 together with the lid member 60 through the second through-hole 63 of the lid member 60.

In the present embodiment, the driving unit 140 is connected to the second sucking and holding unit 120. The second sucking and holding unit 120 is movable in XYZ directions and rotatable in a θ direction around a Z axis by an actuator included in the driving unit 140, and is movable and rotatable relative to the first sucking and holding unit 110. The first sucking and holding unit 110 may be movable with respect to the second sucking and holding unit 120, and both the first and second sucking and holding units 110 and 120 may be movable.

The camera 150 captures an image of a part of the DUT 90 through a first through-hole 11 of the carrier body 10 held by the first sucking and holding unit 110. Specifically, the camera 150 captures an image including the first through-hole 11 of the carrier body 10 and the bump 92' positioned at the corner among the bumps 92 included in the DUT 90 (see FIG. 11A to FIG. 11C). Image information acquired by the camera 150 is transmitted to the image processing unit 160.

Figure 11A:
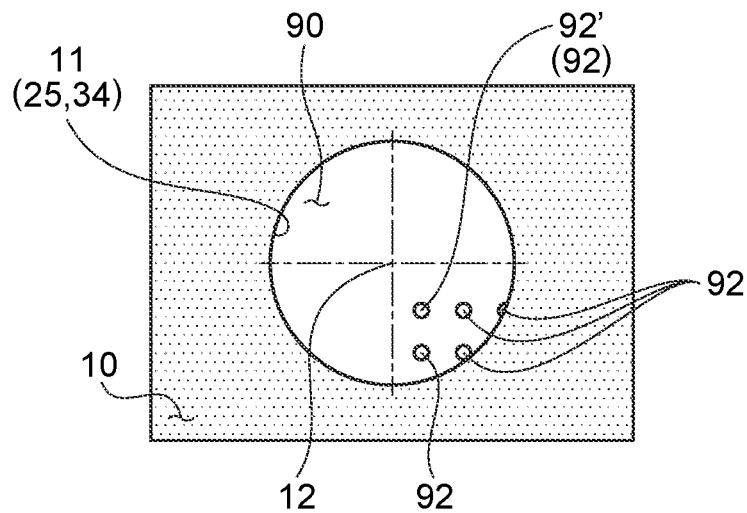
FIG. 11A is a diagram illustrating an image of the DUT before alignment.
Figure 11B:
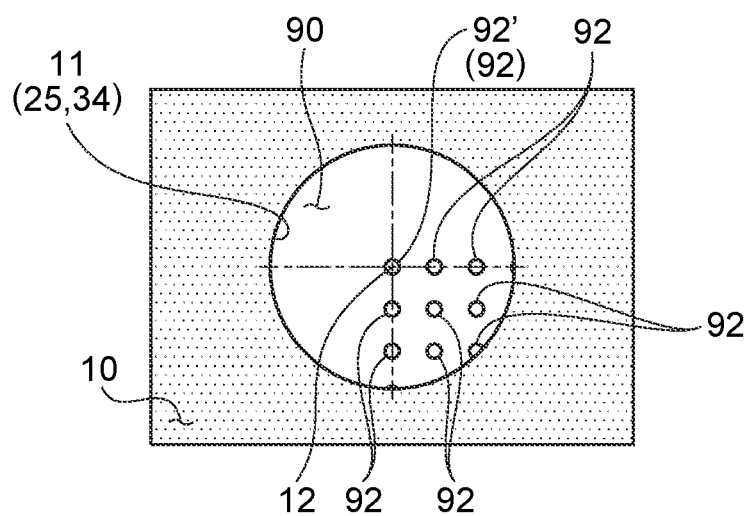
FIG. 11B is a diagram illustrating an image of the DUT during alignment.
Figure 11C:
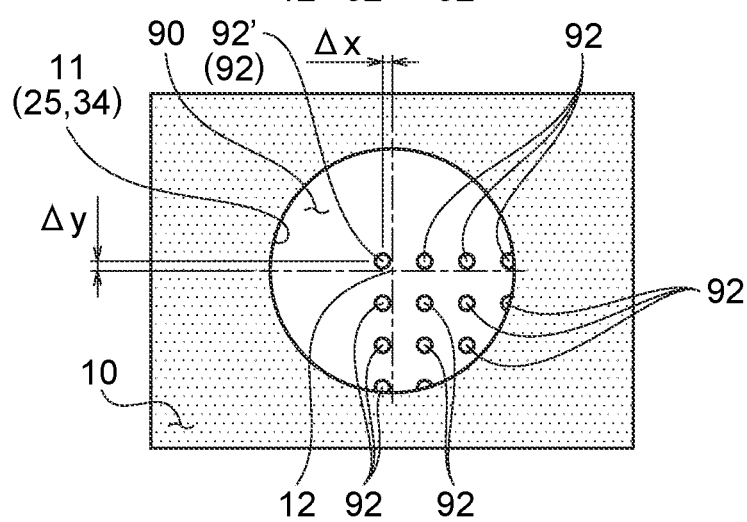
FIG. 11C is a diagram illustrating an image of the DUT after alignment.

The image processing unit 160 detects a position of a center 12 of the first through-hole 11 and a position of the bump 92' by performing image processing on this image information, and acquires a relative position of the bump 92' with respect to the center 12 of the first through-hole 11 (see FIG. 11A to FIG. 11C). A reference for the relative position of the bump 92' is not particularly limited to the center 12 of the first through-hole 11 as long as the position corresponds to a part related to the first through-hole 11.

A feature point of the DUT 90 acquired by the image processing unit 160 for positioning the DUT 90 with respect to the test carrier 1 is not particularly limited to the bump 92' as long as the point corresponds to a characteristic portion in the DUT 90. Although not specifically illustrated, for example, an alignment mark for positioning may be formed on the DUT 90 and this alignment mark may be used as a feature point of the DUT 90.

The reader 170 is a barcode reader that reads the 2D barcode 50 of the carrier body 10 held by the first sucking and holding unit 110. ID information read by this reader 170 is transmitted to the controller 180. The controller 180 reads a correction value corresponding to the ID information of the test carrier 1 from the storage unit 190.

A correction value table having a plurality of correction values respectively corresponding to IDs of test carriers 1 is stored in advance in the storage unit 190. Each of the correction values is a correction value corresponding to an error of a relative position of the first through-hole 11 with respect to the pogo pin 21, the error was generated by processing of the carrier body 10, and the correction values is a value unique to each test carrier 1. Specifically, this correction value is obtained as follows. That is, first, an actual relative position $(x_1, y_1)$ of the center 12 of the first through-hole 11 with respect to the center of the pogo pin 21 is obtained by actually measuring the test carrier 1. Subsequently, a difference $(\Delta x, \Delta y)$ $(=x_0-x_1, y_0-y_1)$ between a design relative position $(x_0, y_0)$ of the center 12 of the first through-hole 11 with respect to the center of the pogo pin 21 and an actual relative position $(x_1, y_1)$ is obtained, and this difference $(\Delta x, \Delta y)$ is set as the correction value. The correction value table is configured by individually associating the correction values of the test carriers 1 with the IDs of the individual test carriers 1. Incidentally, the design relative position $(x_0, y_0)$ of the center 12 of the first through-hole 11 with respect to the center of the pogo pin 21 corresponds to a relative position of a center of the bump 92' with respect to the center of the pad 91 in the DUT 90 (see FIG. 1).

Further, the controller 180 controls the driving unit 140 so as to position the DUT 90 with respect to the carrier body 10 on the basis of the relative position of the bump 92' acquired by the image processing unit 160 and the correction value described above. For example, the image processing unit 160, the controller 180, and the storage unit 190 can be realized by a computer.

Hereinafter, a procedure of accommodating the DUT 90 in the test carrier 1 using the carrier assembling apparatus 100 will be described with reference to FIG. 10 and FIG. 11A to FIG. 11C.

Figure 10:
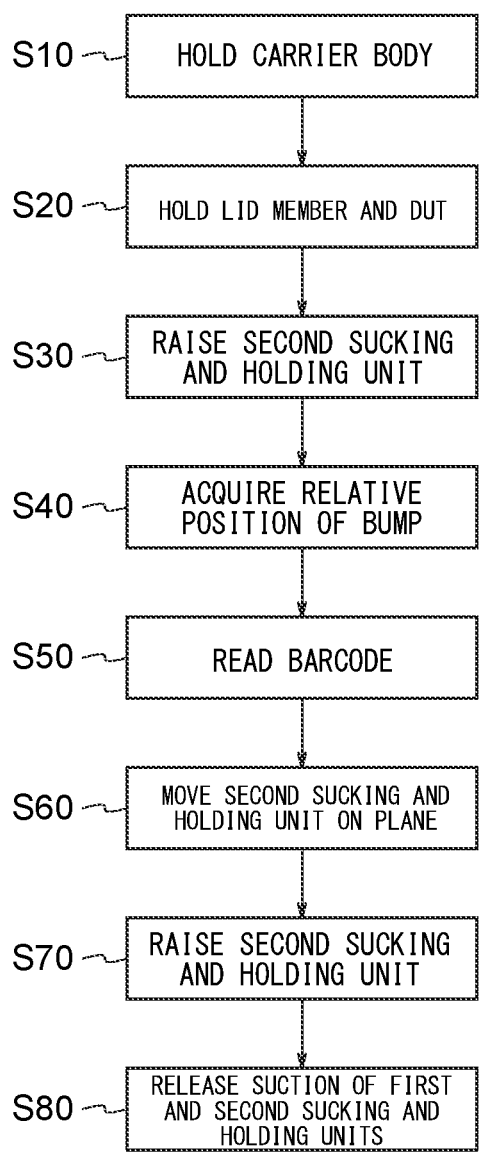
FIG. 10 is a process diagram of a method of assembling the test carrier in the embodiment of the invention.

FIG. 10 is a process diagram of a method of assembling the test carrier in the present embodiment, FIG. 11A is a diagram illustrating an image of the lower surface of the DUT captured by the camera through the first through-hole before alignment, FIG. 11B is a diagram illustrating an image of the lower surface of the DUT captured by the camera through the first through-hole during alignment, and FIG. 11C is a diagram illustrating an image of the lower surface of the DUT captured by the camera through the first through-hole after alignment.

First, in step S10 of FIG. 10, the carrier body 10 of the test carrier 1 is sucked and held by the first sucking and holding unit 110 in a state of being inverted. Similarly, in step S20 of FIG. 10, the lid member 60 and the DUT 90 are sucked and held by the second sucking and holding unit 120 in a state of being inverted.

Subsequently, in step S30 of FIG. 10, the second sucking and holding unit 120 is raised along a Z axis direction by the driving unit 140 to bring the pad 91 of the DUT 90 and the pogo pin 21 of the carrier body 10 close to each other. Although not particularly limited, for example, in this state, an interval between the pad 91 and the pogo pin 21 is about 0.05 mm.

Subsequently, in step S40 of FIG. 10, as illustrated in FIG. 11A, an image of a part of the DUT 90 is captured by the camera 150 through the first through-hole 11, and image information thereof is transmitted to the image processing unit 160. From the image information, the image processing unit 160 acquires a relative position of the center of the bump 92' with respect to the center 12 of the first through-hole 11. The image processing unit 160 transmits the relative position of the bump 92' to the controller 180.

Subsequently, in step S50 of FIG. 10, the 2D barcode 50 assigned to the carrier body 10 is read by the reader 170, and the controller 180 reads a correction value corresponding to ID information thereof from the storage unit 190.

Subsequently, in step S60 of FIG. 10, the controller 180 controls the driving unit 140 on the basis of the relative position of the bump 92' acquired by the image processing unit 160. In the present embodiment, the controller 180 controls the driving unit 140 so that the center of the bump 92' coincides with the center 12 of the first through-hole 11. The driving unit 140 moves the second sucking and holding unit 120 on an XY plane in accordance with an instruction from the controller 180 so that the center of the bump 92' of the DUT 90 is located at the center 12 of the first through-hole 11 (See FIG. 11B).

In step S60, the controller 180 controls the driving unit 140 on the basis of the correction value read from the storage unit 190. The driving unit 140 further moves the second sucking and holding unit 120 on the XY plane in accordance with an instruction from the controller 180 so that the center of the bump 92' of the DUT 90 is separated from the center 12 of the first through-hole 11 by a correction amount $(\Delta x, \Delta y)$ (see FIG. 11C). In this way, the error of each test carrier 1 is taken into consideration, so that the pad 91 is highly accurately positioned with respect to the pogo pin 21.

In practice, in step S60, the control of the driving unit 140 based on the relative position of the bump 92' and the control of the driving unit 140 based on the correction value are executed at the same time. In step S60, the controller 180 may control the driving unit 140 to rotate the second sucking and holding unit 120 in the θ direction on the basis of positions of a plurality of bumps 92'.

Subsequently, in step S70 of FIG. 10, the second sucking and holding unit 120 is further raised by the driving unit 140 along the Z axis direction so that the tubular body 40 of the carrier body 10 abuts against the main body 61 of the lid member 60. In this way, the pad 91 of the DUT 90 is pressed with an optimum pressing force by the pogo pin 21, and the DUT 90 is pinched by the pogo pin 21 and the lid member 60. In addition, as the second sucking and holding unit 120 is raised by the driving unit 140, the claw 72 of the latch 70 is engaged with the recess 42 of the tubular body 40, and the lid member 60 is attached to the carrier body 10.

Subsequently, in step S80 of FIG. 10, in a state in which the test carrier 1 is held by carrying means (not illustrated), suction of the first and second sucking and holding units 110 and 120 is released, and an operation of accommodating the DUT 90 in the test carrier 1 is completed.

As described above, in the present embodiment, since the bump 92' of the DUT 90 can be seen from the outside through the first through-hole 11 of the carrier body 10, it is possible to test the DUT 90 by the testing apparatus 200 through the test carrier 1 after highly accurately positioning the pad 91 of the DUT 90 with respect to the pogo pin 21 of the test carrier 1 by the carrier assembling apparatus 100. For this reason, in a test process of the DUT 90, it becomes possible to use an existing inexpensive handler having a mechanical positioning mechanism and to remarkably increase the number of simultaneous measurements, and thus it is possible to reduce the cost of the test process of the DUT 90 having a fine pitch.

In the present embodiment, since a terminal 91 of the DUT 90 is positioned with respect to the pogo pin 21 of the carrier body 10 on the basis of the relative position of the bump 92' of the DUT 90 with respect to the first through-hole 11 of the carrier body 10, a camera for capturing an image of the pogo pin 21 is unnecessary, and the cost of the carrier assembling apparatus 100 can be reduced.

In the present embodiment, the test carrier has the 2D barcode 50 indicating an ID, and the carrier assembling apparatus 100 positions the terminal 91 of the DUT 90 with respect to the pogo pin 21 of the carrier body 10 by taking an error unique to the individual test carrier 1 into consideration on the basis of ID information thereof. For this reason, it is possible to highly accurately position the DUT 90 with respect to the test carrier 1.

The above-described embodiment is used to facilitate the understanding of the invention and does not limit the invention. Thus, the components disclosed in the above-described embodiment include all modifications in design and equivalents belonging to the technical scope of the invention.

For example, in the above-described embodiment, the die is given as a specific example of the DUT 90. However, the DUT 90 is not particularly limited thereto. For example, the DUT 90 which is a test object may be the packaged device.

EXPLANATIONS OF LETTERS OR NUMERALS

| | | | |
|---|---|---|---|
| 1 | TEST CARRIER | | |
| | 10 | CARRIER BODY | |
| | | 11 | FIRST THROUGH-HOLE |
| | | 12 | CENTER |
| | | 13 | CLOSING MEMBER |
| | 20 | HOLDING PLATE | |
| | | 201 | HOLDING HOLE |
| | | 202 | STEP |
| | | 203, 204 | OPENING |
| | 21 | POGO PIN | |
| | | 22 | PLUNGER |
| | | | 221 FLANGE |
| | | 23 | FIXING PORTION |
| | | | 231 REAR END |
| | | | 232 SHAFT PORTION |
| | | 24 | COIL SPRING |
| | | 25 | OPENING |
| | 30 | INTERPOSER | |
| | | 31 | INTERNAL TERMINAL |
| | | 32 | EXTERNAL TERMINAL |
| | | 33 | WIRING PATTERN |
| | | 34 | OPENING |
| | 40 | TUBULAR BODY | |
| | | 41 | INNER HOLE |
| | | 42 | RECESS |
| | 50 | TWO-DIMENSIONAL BARCODE | |
| 60 | LID MEMBER | | |
| | 61 | MAIN BODY | |
| | | 62 | PUSHER |
| | | 63 | SECOND THROUGH-HOLE |
| | 70 | LATCH | |
| | | 71 | SHAFT |
| | | 72 | CLAW |
| | 90 | DUT | |
| | | 91 | PAD |
| | | 92, 92' | BUMP |
| | 100 | CARRIER ASSEMBLING APPARATUS | |
| | | 110 | FIRST SUCKING AND HOLDING UNIT |
| | | 120 | SECOND SUCKING AND HOLDING UNIT |
| | | 130 | DECOMPRESSION UNIT |
| | | 140 | DRIVING UNIT |
| | | 150 | CAMERA |
| | | 160 | IMAGE PROCESSING UNIT |
| | | 170 | READER |
| | | 180 | CONTROLLER |
| | | 190 | STORAGE UNIT |

The invention claimed is:

1. A test carrier that accommodates a device under test (DUT), the test carrier comprising:
a carrier body that holds the DUT; and
a lid member that covers the DUT and is attached to the carrier body, wherein
the test carrier accommodating the DUT is carried to a testing apparatus comprising a socket and is mounted on the socket during a test of the DUT,
the carrier body has
contactors provided to correspond to terminals of the DUT,
external terminals electrically connected to the contactors, and electrically connected to the socket while the test carrier is mounted on the socket, and
a first through-hole through which the DUT is positioned with respect to the carrier body, and
the first through-hole faces the DUT and penetrates the carrier body such that a part of the DUT is visible from an outside through the first through-hole by an imaging unit that captures an image of the DUT through the first through-hole.

2. The test carrier according to claim 1, wherein a pitch of the external terminals is wider than a pitch of the contactors.

3. The test carrier according to claim 1, wherein
the contactors include pogo pins that press the terminals of the DUT, and
the DUT is pinched between the pogo pins and the lid member by pressing forces of the pogo pins.

4. The test carrier according to claim 1, wherein
the carrier body includes
a holding plate that holds the contactors, and
an interposer that the holding plate is laid on, and
the interposer includes
the external terminals,
internal terminals provided to face the contactors, and
a wiring pattern that connects the internal terminals and the external terminals to each other.

5. The test carrier according to claim 1, wherein the test carrier includes a latch mechanism that detachably attaches the lid member to the carrier body.

6. The test carrier according to claim 1, wherein the test carrier includes an identifier for identifying the test carrier.

7. The test carrier according to claim 6, wherein
the lid member has a second through-hole through which the DUT is sucked, and
the second through-hole penetrates the lid member and faces the DUT.

8. A carrier assembling apparatus for assembling the test carrier according to claim 1, the carrier assembling apparatus comprising:
- the imaging unit that captures the image of the DUT through the first through-hole;
- an image processing unit that acquires a relative position of a feature point of the DUT with respect to the first through-hole from image information captured by the imaging unit;
- a driving unit that moves the DUT relative to the carrier body; and
- a controller that controls the driving unit, wherein
- the controller controls the driving unit on the basis of the relative position of the feature point.

9. The carrier assembling apparatus according to claim 8, further comprising:
- a reader that reads an identifier on the test carrier and that identifies the test carrier; and
- a storage unit that stores individual unique information corresponding to the identifier, wherein
- the individual unique information includes a correction value corresponding to an error of a relative position of the first through-hole with respect to the contactor, and
- the controller controls the driving unit on the basis of the relative position of the feature point and the individual unique information.

10. The carrier assembling apparatus according to claim 8, further comprising:
- a sucking and holding unit that
  - sucks and holds the lid member, and
  - sucks and holds the DUT through a second through-hole that penetrates the lid member and faces the DUT, wherein
- the driving unit moves the sucking and holding unit.

* * * * *